United States Patent
Regulapati et al.

(10) Patent No.: US 10,622,083 B2
(45) Date of Patent: Apr. 14, 2020

(54) TECHNIQUES FOR PROVIDING SIGNAL CALIBRATION DATA

(71) Applicant: Intel Corporation, Santa Clara, CA (US)

(72) Inventors: Varsha Regulapati, Folsom, CA (US); Heonwook Kim, San Jose, CA (US); Aliasgar S. Madraswala, Folsom, CA (US); Naga Kiranmayee Upadhyayula, Olympia, WA (US); Purval S. Sule, Folsom, CA (US); Jong Tai Park, Pleasanton, CA (US); Sriram Balasubrahmanyam, Folsom, CA (US); Manjiri M. Katmore, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/168,809

(22) Filed: Oct. 23, 2018

(65) Prior Publication Data

US 2019/0252033 A1    Aug. 15, 2019

(51) Int. Cl.
| | |
|---|---|
| *G11C 29/00* | (2006.01) |
| *G11C 29/02* | (2006.01) |
| *G06F 12/02* | (2006.01) |
| *G11C 16/04* | (2006.01) |
| *G06F 13/16* | (2006.01) |
| *G11C 16/32* | (2006.01) |
| *G11C 16/20* | (2006.01) |

(52) U.S. Cl.
CPC ........ *G11C 29/023* (2013.01); *G06F 12/0246* (2013.01); *G06F 13/1668* (2013.01); *G11C 16/0483* (2013.01); *G11C 16/20* (2013.01); *G11C 16/32* (2013.01); *G11C 29/02* (2013.01); *G11C 29/028* (2013.01)

(58) Field of Classification Search
CPC .............................. G11C 29/023; G11C 16/32
See application file for complete search history.

(56) References Cited

U.S. PATENT DOCUMENTS 10,325,636 B1 * 6/2019 Purohit .................. H03K 5/135
2014/0293710 A1 * 10/2014 Ware .................... G11C 7/1066
                                                                       365/189.02

OTHER PUBLICATIONS

Intel Corporation, Micron Technology, Inc. et al., "Open NAND Flash Interface Specification" Revision 4.1, Dec. 12, 2017, 338 pages.

* cited by examiner

*Primary Examiner* — Uyen B Tran
(74) *Attorney, Agent, or Firm* — Compass IP Law PC

(57) ABSTRACT

In connection with data pin timing calibration with a strobe signal, examples provide for determination of pass/fail status of a pin from multiple pass/fail results in a single operation. Determination of pass/fail results for multiple pins based on multiple applied trim offsets can be made in parallel. Accordingly, a time to determine pass/fail results from multiple trim values for a pin can be reduced, which can enable faster power-up of NAND flash devices.

20 Claims, 9 Drawing Sheets

TECHNIQUES FOR PROVIDING SIGNAL CALIBRATION DATA

TECHNICAL FIELD

Various examples are described herein that relate to techniques to calibrate timing of input or output signals with a clock signal.

BACKGROUND

The Open NAND Flash Interface (ONFI) is an industry Workgroup that defines standardized component-level interface specifications as well as connector and module form factor specifications for NAND flash memory devices. ONFI revision 4.1 (December 2017) at section 5.30.4.4 defines a Write-RX training algorithm which is performed to adjust NAND receiver DQ-DQS timing. A data input/output signal is represented as a DQ signal and the data strobe signal is represented as a DQS signal. The DQS signal is driven by the host when the host writes data via the DQ signal into the NAND device. The DQS signal is driven by the NAND device when the NAND device sends data via the DQ signal to the host. Each rising and falling edge of the DQS signal can be used to read or write data.

For example, ONFI revision 4.1 training sequences are supported by NAND flash devices with interface speeds greater than 800 mega transfers per second (MT/s). A Solid State Drive (SSD) can include NAND flash devices. The ONFI revision 4.1 training sequence adds to the time to complete an SSD power-up sequence. The time to complete an SSD power-up sequence impacts how quickly an SSD is available for use by a customer after powering up.

DETAILED DESCRIPTION

Figure 1:
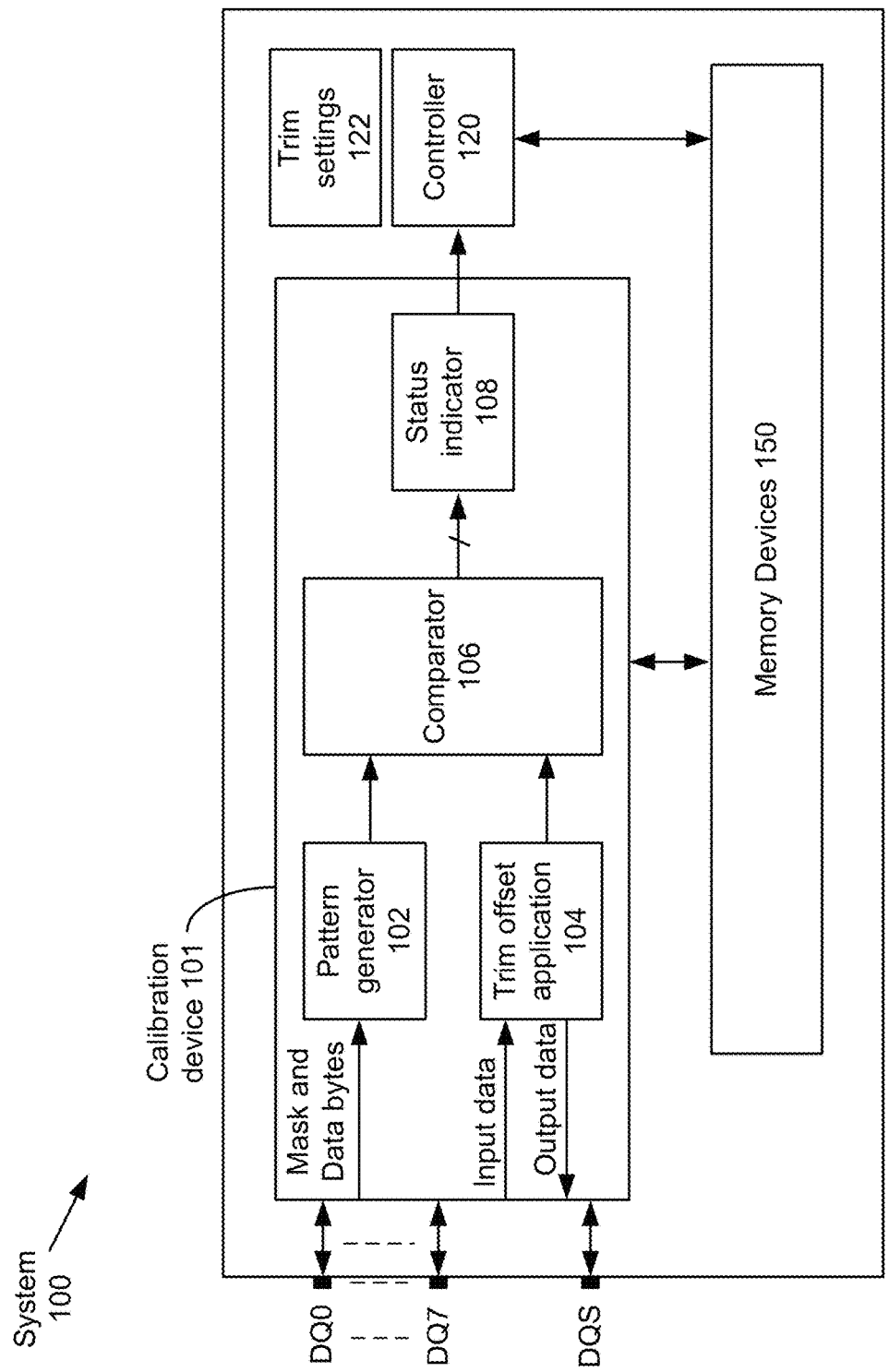
FIG. 1 depicts an example system that can be used for calibration of signals received on DQ pins.

Various embodiments can reduce time to perform Write-RX calibration and specifically the time taken to generate pass or fail data concerning application of trim correction settings applied to one or more DQ pins. For example, Write-RX calibration training can be performed according to section 5.30.4.4 of ONFI revision 4.1. Although, any other type of data input/output and data strobe calibration can use embodiments described herein.

DQ-DQS calibration is performed based on a comparison between received input data and generated data patterns with application of 16 trim codes to the received input data. A trim code value defines an applied time offset (earlier-in-time shift or later-in-time shift) to a signal received on a DQ pin. For example, if a trim code value is 000, a delay of X picoseconds can be applied to a signal received on a DQ pin. If a trim is 001, a delay of X+n picoseconds can be applied to a signal received on a DQ pin. From the Write-RX training, each of the 8 DQ pins is individually calibrated to use any of 16 different trim settings.

For calibration of 8 pins using 16 trim settings, a calibration circuit sends calibration pass/fail results to a NAND controller for all 8 DQ pins based on pass/fail results from application of the 16 trim settings. The calibration circuit can form pass/fail information for 8 pins using any of the 16 trim values. The calibration circuit can generate pass/fail information for 8 pins for 4 groups of trim values in parallel. For example, a group of trim values can be sequential in numerical value. Moreover, determination of pass/fail information for 8 pins for a group of 4 trim values can occur in parallel with determination of pass/fail information for 8 pins for other one or more groups of 4 trim values for the same 8 pins.

Instead of counting a number of passes for each pin for a group of applied trim codes and determining whether the number of passes meets or exceeds a threshold, a transformation matrix can be used to determine whether the threshold number of passes for a pin has occurred over a group of applied trim values. If a threshold number of passes for a pin occurred over a group of trim values, the controller can record a pass for the pin for that group of applied trim codes. A transformation matrix can be determined based on pass/fail results for 8 pins for 4 applied trim codes so an indication of whether the threshold was met or not is provided for each pin. For example, for a group of 4 bytes, where each bit of a byte represents whether a pin DQ0 to DQ7 passes or fails and each byte represents pass/fail results for a different applied trim value, the transformation matrix can provide a byte that indicates whether a pin is determined to have passed or failed. Pass/fail information for other numbers of DQ pins, other number of trim settings, or other sizes of groups of trim codes can be determined. Pass/fail information for pins other than DQ pins can be made available.

On some current NAND devices, a write-RX training sequence determines pass/fail information for 8 pins for a group of 4 trim results serially, by considering pass or fail results for one pin at a time. Thus, a write-RX training sequence that determines pass or fail results for one pin at a time can add to a time to perform the SSD power-up sequence. Using some embodiments, performance of write-RX training sequence can be accelerated which in turn will enable faster power-up of NAND flash devices and ability to write data to the NAND device or read data from the NAND device sooner.

FIG. 1 depicts an example system 100 that can be used for calibration of DQ-DQS variations in a memory or storage device. System 100 can be used to receive data from a memory device 150 or send data to a memory device 150, where memory device 150 is a non-volatile and/or volatile memory device. Calibration can be performed to determine a trim code to apply to each DQ pin so that signals received by the DQ pin are output at some offset (earlier or later in time) relative to when the signals are output. In some embodiments, calibration device 101 can determine a pass/fail state for a range of trim settings applied to received data signals on multiple data pins by using a transformation matrix to determine the pass/fail state in one step instead of determining pass/fail state for the range of trim settings for each pin serially. The range of trim settings can be four different trim settings. Calibration device 101 can output the pass/fail states for each group of a range of trim settings to controller 120. Controller 120 can determine the trim setting to apply for a signal received on each pin, that is, whether to modify timing of output of the signal by advancing it in time or delaying it in time. For example, trim offsets can be applied in either or both of signals received by a DQ pin for transfer to a memory or storage device or signals received by a DQ pin from a memory or storage device for transmission to a host.

Timing offset calibration for DQ pins can be performed at power-up, a threshold temperature change over time, a threshold change in power supply voltage over time, or at the request of a user or administrator of the NAND device or other memory or storage device. For example, a threshold change in temperature can be a change of 1.2 degrees C./second. For example, a threshold change in bias voltage can be a change of 10 mV/second.

A device connected to system 100, such as a host computing device or its delegate, sends Mask/Data Bytes to calibration device 101 via DQ pins. The device can send three bytes of training information: a mask, data byte 1, and data byte 2 to the calibration circuitry. Pattern generator 102 can generate and output a data pattern based on these three bytes. ONFI revision 4.1 specifies pattern generation based on mask/data bytes for example at section 5.30.4.4. The device that sent the training information can also send a data pattern as an input data signal to calibration device 101. Trim offset application device 104 can apply one or more trim offsets to an input data signal. A trim offset value applied to the received data signal can cause the data signal received on a DQ pin to shift the input data signal forward or backward in time but maintain the frequency of the data signal. For example, a trim offset value can be applied to the data signal received on DQ pins such as DQ pins 0 to 7 (DQ0 to DQ7). A second, different, trim offset value can be applied to the data signal received on the same DQ pins. Transitions of a data strobe signal or clock signal (received on pin DQS) are used to capture the bits conveyed by the received data signal with applied trim offset value.

Comparator 106 can compare the captured received data signals with the applied trim offsets from trim offset application device 104 against the generated data pattern from pattern generator 102. The captured received data signal as offset by a first trim offset is compared against the generated data pattern. Likewise, the captured received data signal as offset by a second trim offset is compared against the generated data pattern. Additional trim offsets can be applied to the received data signal and a comparison made against the generated data pattern. For an applied trim offset and for a pin, if there is a match between the captured received data signal and the generated data pattern timed according to the data strobe signal at pin DQS, then comparator 106 makes an indication of a pass. However, for the applied trim offset and for the pin, if there is a mismatch between the captured received data signal and the generated data pattern timed according to the data strobe signal received at pin DQS, then comparator 106 makes an indication of a fail. Based on the comparison, calibration device 101 can provide pass/fail information for each pin and for each applied trim value to status indicator 108.

Status indicator 108 can determine pass/fail results for multiple pins based on multiple applied trim offsets in parallel or in one step. The pass/fail information for a variety of trim settings can be provided by status indicator 108 to controller 120. For example, pass/fail information for multiple trim settings that are contiguous or consecutive in time offset can be in a group and the pass/fail results from the multiple trim settings can be combined for each pin. Multiple groups of trim settings can be provided to controller 120. Controller 120 can determine what trim setting to apply for each DQ pin based on received pass/fail information for groups of applied trim values. Determined trim settings for each pin can be stored in trim settings 122, which can be a register or stored in memory or storage. Determined trim settings can be applied using trim offset application device 104 to received or transmitted signals from or to the DQ pin. For example, for signals received on pins DQ0 to DQ7 (e.g., data) to be provided to memory devices 150, trim offset application device 104 can apply the determined trim settings and provide the corresponding timing offset to those signals. For signals to be transmitted from pins DQ0 to DQ7, such as signals from memory devices 150, trim offset application device 104 can apply trim settings to provide corresponding timing offset to those transmitted signals.

Figure 2:
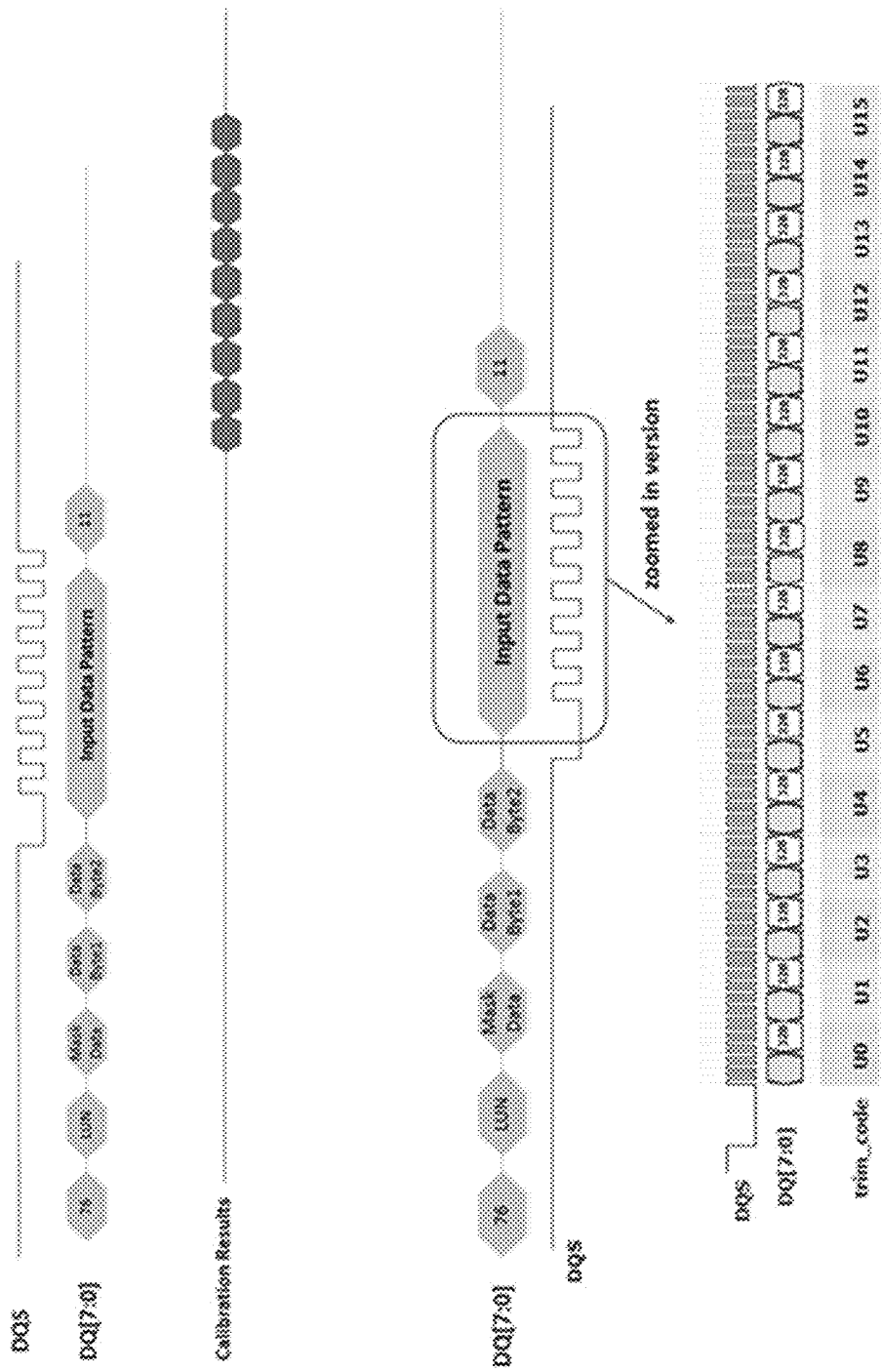
FIG. 2 depicts an example of signals received in connection with calibration of multiple data signals.

FIG. 2 depicts an example of signals received in connection with calibration of multiple data pins. The mask byte, data byte1, and data byte2 can be received on pins DQ[7:0]. The mask byte, data byte1, and data byte2 can be used to generate a data pattern. The input data pattern received on pins DQ[7:0] is captured for a variety of offsets based on trim codes and timed according to a strobe signal received on pin DQS. A calibration circuit compares the captured input data signals, with applied offset, against the generated data patterns and generates pass/fail results for all of pins DQ[7:0]. In an example, 16 trim codes are applied to signals received on each of the pins and four pass/fail determinations are made per applied trim code. Final trim codes can be determined for each pin DQ[7:0] based on the pass/fail information.

Figure 3:
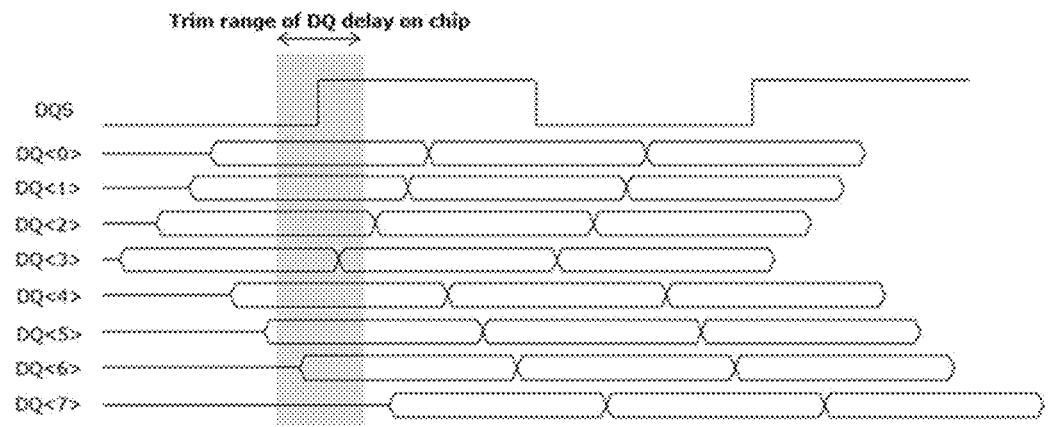
FIG. 3 shows an example of a trim range window.

FIG. 3 shows a trim range window such that transitions of signals received on pins DQ[7:0] can be offset to occur up to the start of the window or delayed to occur at the end of a window, where the window encompasses a time region before and after a transition of signal DQS. The window can be centered at the transition of DQS or offset earlier in time or later in time and not centered at the transition. A trim code modifies timing of a signal so that the signal on a pin is shifted to the left (earlier in time) or to the right (later in time) but up to a maximum offset based on the window size and not shifted outside of the boundaries of the window. Measurements of values of the input data signal can be made on transitions of the strobe signal on pin DQS. In some cases, the transition of a data signal on a pin is to occur outside of the window so that the data signal can be measured accurately at the transition of the strobe signal on pin DQS.

Figure 4:
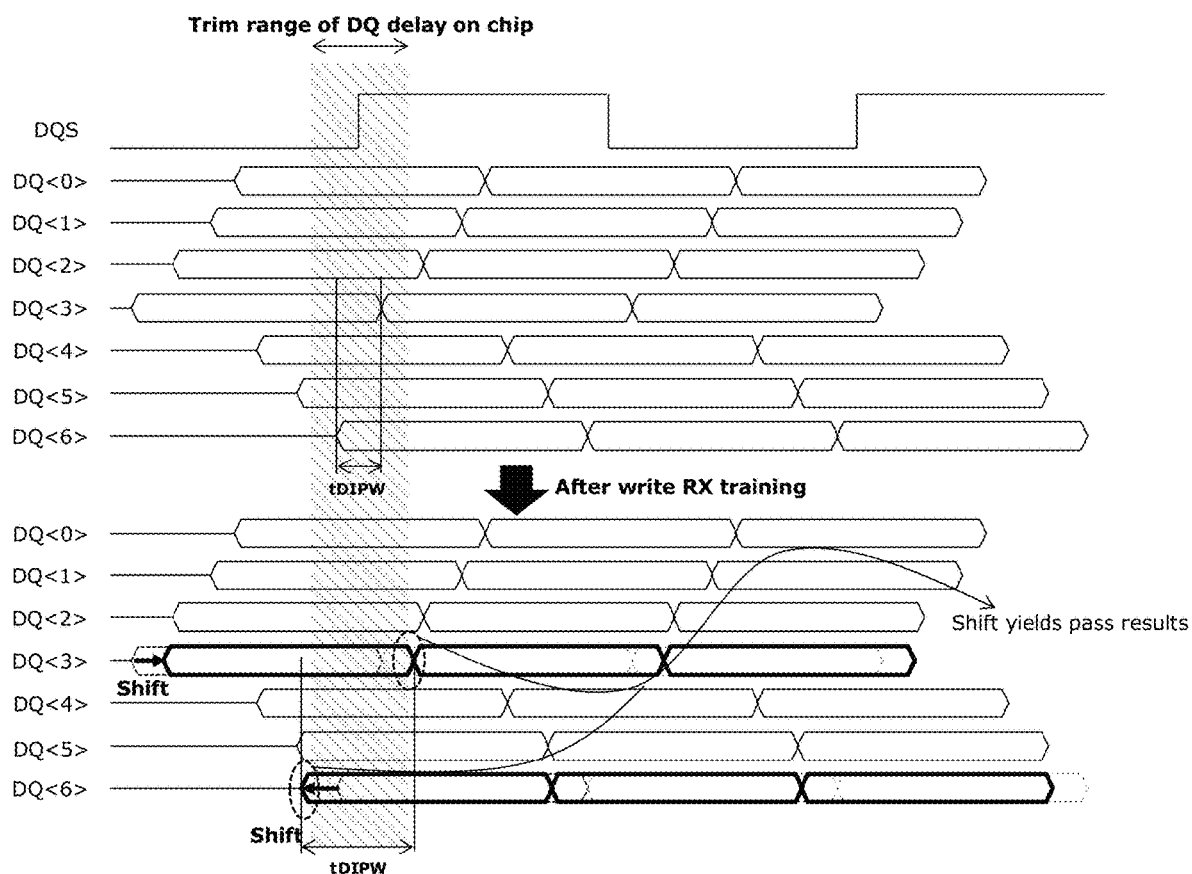
FIG. 4 depicts an example scenario where signals on several pins can be offset using trim offsets.

FIG. 4 depicts an example scenario where signals on several pins transition within the trim range window and can be offset so that the signals on those pins transition at the edge of the trim range window or outside of the trim range window. In this example, signals on pins DQ<3> and DQ<6> transition within the trim range window. For pin DQ<3>, the signal can be delayed so that it transitions after the window ends or as the window ends. For pin DQ<6>, the signal can be shifted to earlier in time to shift before the window begins or as the window begins. A default amount of delay can be added to signals received on DQ pins. For example, to shift to earlier in time, there may be a delay setting so that less delay is added to the signal than the default delay which appears to cause a shift to the signal to being output earlier in time. For a right shift, more delay can be added than a default amount of delay. The example of FIG. 4 shows an application of the same or different trim settings to signals received on pins DQ<3> and DQ<6> to allow signals on those pins to be properly read using strobe signal DQS after write-RX calibration is performed.

Figure 5:
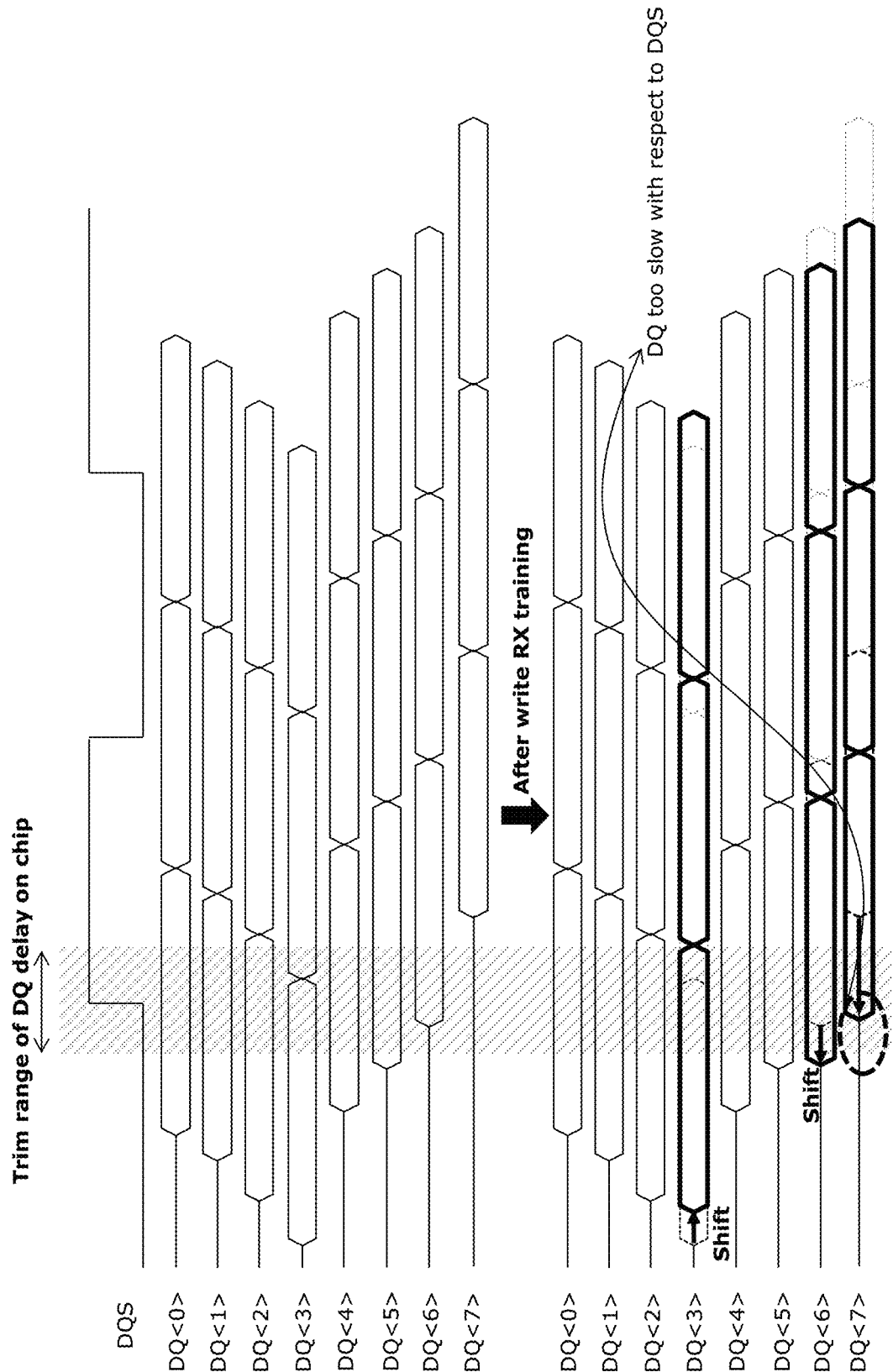
FIG. 5 depicts an example scenario where a signal on a pin cannot be offset using a trim offset.

FIG. 5 depicts an example scenario in which certain pins provide signals that transition within the trim range window relative to a transition of a signal on pin DQS. In this example, a signal on pin DQ<3> transitions within the window and can be shifted right by application of a delay specified using a trim code to transition at the edge of the window or outside the window. A signal on pin DQ<6> transitions within the window and can be shifted left by application of a shift specified by a trim code so that the transition occurs at the edge of the window or outside of the window. However, a signal on pin DQ<7> transitions within the window but there is not enough available left or right shift to cause the signal to transition outside or at the edge of the window. Accordingly, calibration of pin DQ<7> fails during write-RX calibration.

Figure 6:
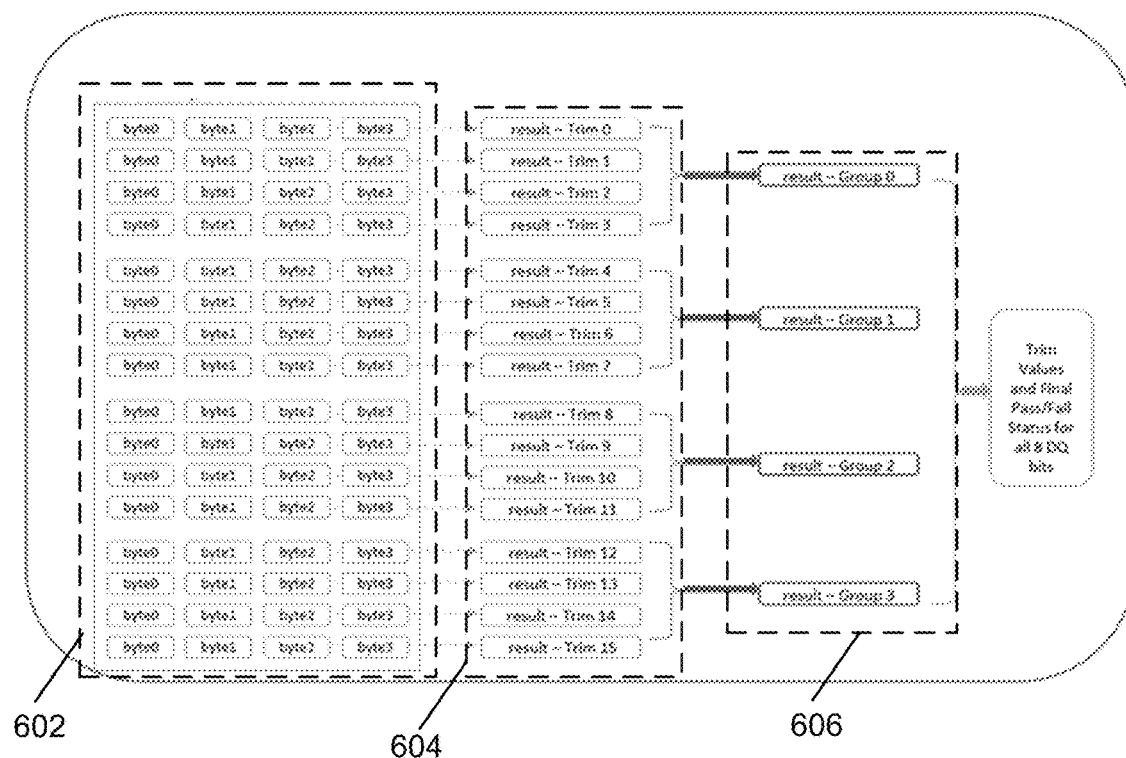
FIG. 6 shows an example of generation of pass/fail information for pins from multiple trim codes.

FIG. 6 shows an example of generation of pass/fail information for pins from application of multiple trim codes. At 602, four pass/fail results are provided based on a comparison between a received input data signal as offset by a trim value and the generated data signal for each pin measured using a strobe signal. The four pass/fail results can be in the form of byte0 to byte3, where each bit of byte0 to byte3 represents a pass/fail result for a pin. Four pass/fail results can arise out of four comparisons. Other numbers of comparisons can be made. For example, bit0 of byte0 to byte3 represent pass/fail status of a pin0 and bit1 of bye0 to byte3 represent pass/fail status of a pin1. In an example, 16 trim settings are applied across all 8 DQ pins and 4 sets of results for the DQ pins are provided at 602. Accordingly, 64 bytes are provided to represent pass/fail information for application of 16 trim codes. At 604, result-Trim0 to result-Trim15 represent a compilation of results from byte0 to byte3. For example, Trim0 can represent an OR operation across byte0 to byte3, Trim1 can represent an OR operation across byte0 to byte3, and so forth. For example, if all bit0 in byte0 to byte3 are 0 (pass) values, then bit0 in result-Trim0 is 0 (pass). But if any bit in bit0 (which represents a DQ0 pin) across byte0 to byte3 is a 1 (fail) value, then bit0 in result-Trim0 is a 1 (fail). For example, a logical 0 can represent a pass and a logical 1 can represent a fail. Accordingly, in an example, unless DQ0 in all 4 bytes (byte0-byte3) are pass, then bit 0 is indicated as passing for trim code 0 and reflected in a result-Trim0. The resulting trim results, result-Trim 0 to result-Trim 15, are each 1 byte.

At 606, results from a group of trim results can be used to form a group representation of pass/fail information for each pin. For example, a result-group 0 can be a representation of results from Trim0 to Trim 3, a result-group 1 can be a representation of results from Trim4 to Trim 7, and so forth. The result-Group0 to result-Group 3 represent pass/fail status for all pins based on application of 16 trim values. Accordingly, 16 bytes of calibration information can be represented as 4 bytes. Various embodiments provide a manner of forming pass/fail status for each pin arising from pass/fail results based on application of multiple trim values in parallel. Such formed pass/fail status can be used by a controller to determine trim values to use for each pin.

Figure 7:
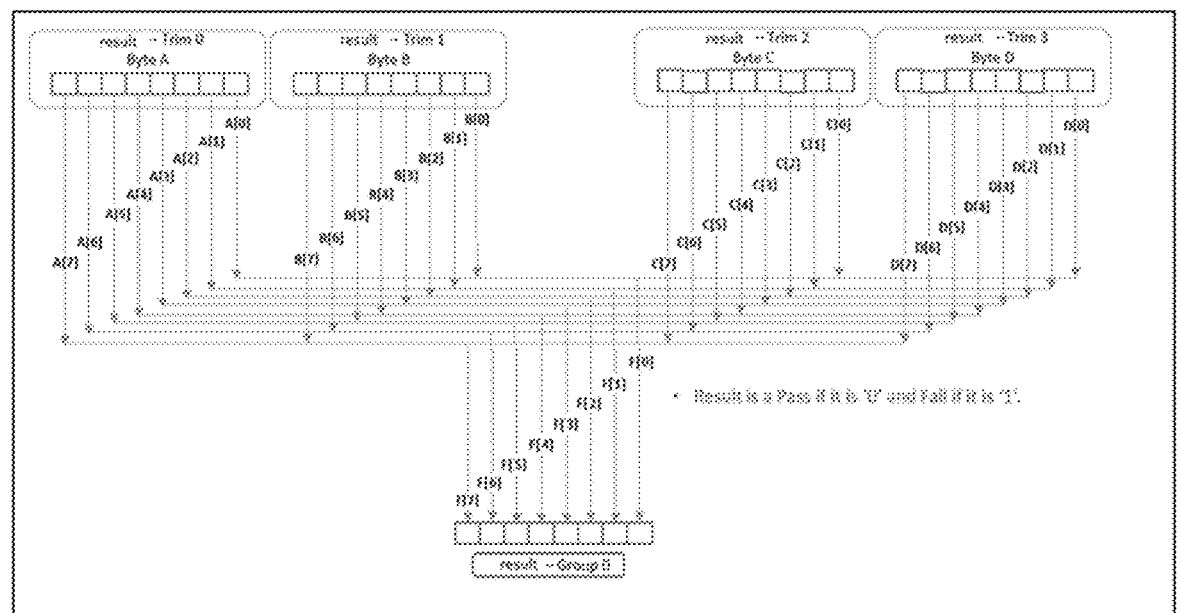
FIG. 7 depicts an example manner to form a pass/fail information from multiple pass/fail results from applied trim offsets.

FIG. 7 depicts an example manner to form a result-Group0 from result-Trim0 to result-Trim3. The same processing can apply to result-Group1 to result-Group3 where each of result-Group0 to result-Group3 are generated in parallel with each other, or at least partially in parallel with each other. To determine whether a pin in a result-Group0 passes or fails, a number of passes from result-Trim0 to result-Trim3 can be counted. In an embodiment, if N or more passes are counted for the pin from result-Trim0 to result-Trim3, then bit representing the pin can be marked in result-Group0 as a pass. In an embodiment, if N−1 or fewer passes are counted for the pin from result-Trim0 to result-Trim3, then a bit representing the pin can be marked in result-Group0 as a fail. In some embodiments, N=3, although other values of N can be used. For example, if bit0 (corresponding to pin DQ0) is a pass in N or more of result-Trim0 to result-Trim3, bit0 in result-Group0 is marked as a pass. In some embodiments, for right and left most bit positions (e.g., bit7 and bit0), N=4. Similar operations can occur to determine result-Group1 to result-Group3.

Figure 8:
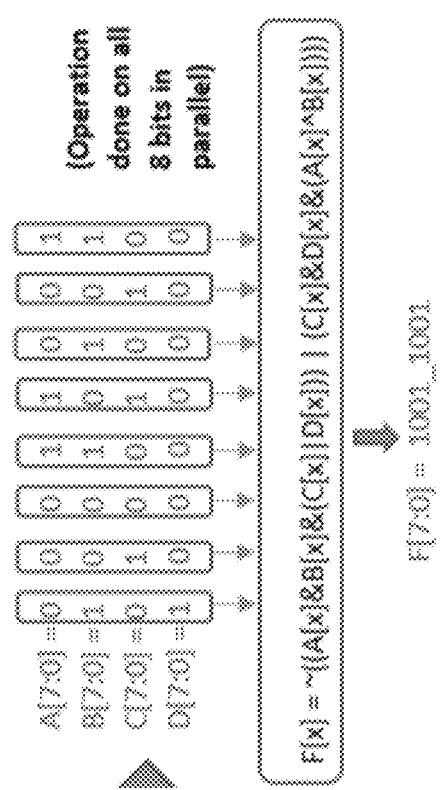
FIG. 8 shows an example where pass/fail results for multiple applied trim offsets can be determined for multiple pins in one step.

FIG. 8 shows an example where pass/fail results for multiple applied trim offsets can be determined for multiple pins in one step. In this example, A[7:0] represent results from result-Trim0, B[7:0] represent results from result-Trim1, C[7:0] represent results from result-Trim2, and D[7:0] represent results from result-Trim3. For all combinations of A[7:0], B[7:0], C[7:0], D[7:0], a determination of pass/fail for each pin[7:0] based on multiple pass/fail results can be made using the following relationship:

$$F[x]=\sim((A[x]\&B[x]\&(C[x]|D[x])|(C[x]\&D[x]\&(A[x]\char`\^B[x])), \text{ where } x=0 \text{ to } 7.$$

Accordingly, counting a number of passes (number of zeros) among multiple results can be performed in parallel. In other words, a determination of pass/fail results for all of pin[7:0] can be made from an inverse of ((A[x] AND B[x] AND (C[x] OR D[x])) OR (C[x] AND D[x] AND (A[x] XOR B[x])).

Various embodiments provide for determination of pass/fail status of a pin from multiple pass/fail results in a single operation. A result group can represent trim codes that are close in value, for example consecutive offset trim values. For example, determination of pass/fail results for 8 pins (or other numbers of pins) can be made in parallel. In other words, pass/fail status of a pin in a trim group by considering pass/fail statuses from multiple trim results can be made in parallel. In some embodiments, pass/fail status of a pin in a trim group can be made based on pass/fail statuses for different trim levels. Accordingly, a time to determine pass/fail results from multiple trim values for a pin can be reduced, which can enable faster power-up of NAND flash devices and improve the SSD Power-On specification.

A trim value for each pin can be determined based on group pass/fail results for each pin. For example, for a first pin, if trim settings in a group show a pass towards lower trim values (trim0-trim4) but failures in trim values (trim5-trim15), then a trim setting towards the lower trim values (trim0-trim4) is chosen for the pin (e.g., trim 0). For example, for a second pin, if trim settings show a failure towards lower trim values (trim0-trim4) but a pass in higher trim values (trim5-trim15), then a trim setting towards the higher trim values (e.g., trim 15) is chosen for the pin. For example, for a third pin, if trim settings show a failure towards lower trim values (trim0-trim4), a pass in middle trim values (trim5-trim10), and failure towards higher trim values (trim11-trim15), then a trim setting towards the middle trim values (e.g., trim 8) can be chosen for the pin. The trim value can be stored for use to offset signal transmission from a pin during receipt of input data to the memory or storage device or transmission of data from the memory or storage device.

Figure 9:
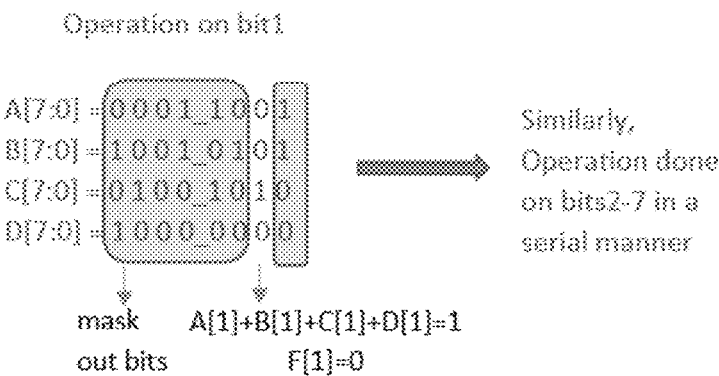
FIGS. 9 and 10 show an example of a manner of determining a number of passes for a pin where counting the number in each column is performed by masking out other columns.
Figure 10:
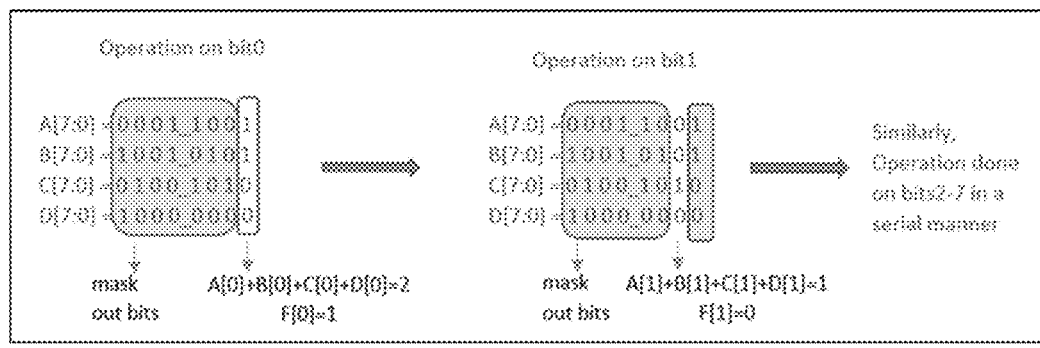
Figure 11:
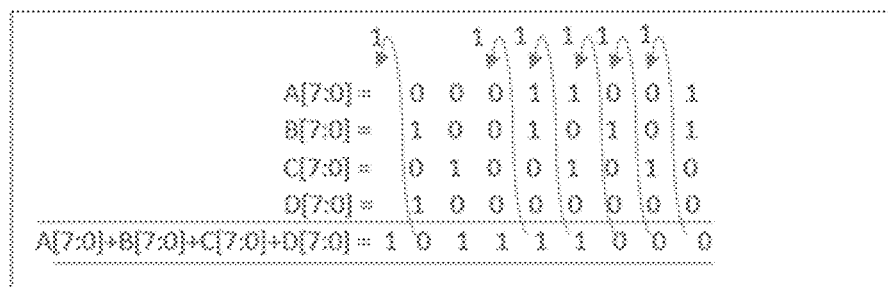
FIG. 11 shows an example of overflow from summation of one column to another column that can cause an error in the adjacent column.

By contrast, FIGS. 9-11 show an example of a manner of determining a number of passes for a pin to determine a result-Group from pass/fail results for multiple applied trim codes, where counting the number in each column is performed by masking out other columns. The first bit (corresponding to pin DQ0) of all the 4 bytes of pass/fail information can be isolated and other bits masked off. The first values stored in the first bit are added and a determination is made if the resulting number of passes is more than or equal to N. This process is repeated 8 times for each DQ pin to calculate a number of passes for each of the 8 DQ pins.

Using this approach, counting passes of values stored in all 8 bits across the 4 pass/fail results cannot be performed in parallel. Adding A[7:0], B[7:0], C[7:0], D[7:0] will cause carry-over and over-flow which will cause spillover of result from bit0 onto bit1 and so-forth. FIG. 11 shows an example of overflow from summation of one column to another column that can cause an error in the adjacent column. The process applied in FIGS. 9-11 can slow-down a power up sequence on memory or storage devices because pass status in each bit position are determined one bit position at a time.

Figure 12:
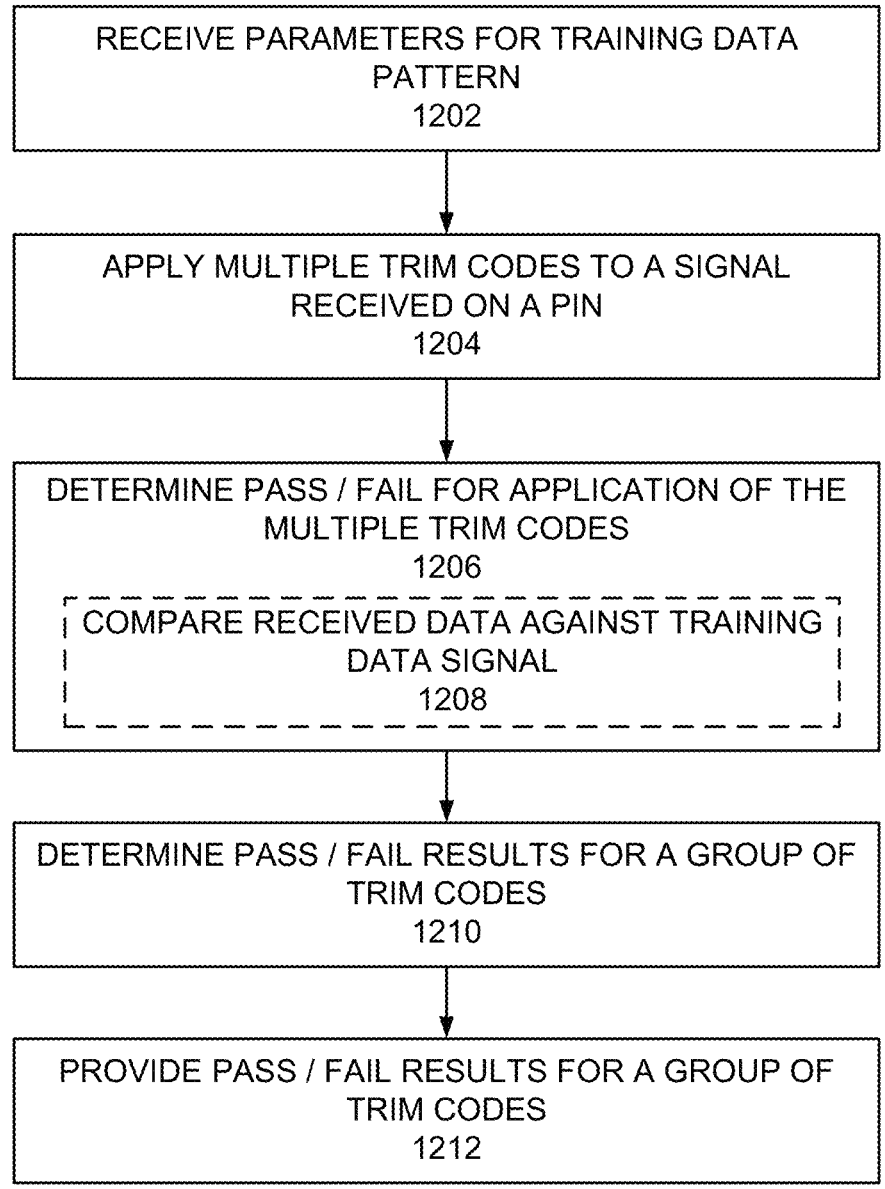
FIG. 12 shows an example process that can be used to determine pass/fail results for multiple pins using various trim offsets.

FIG. 12 shows an example process that can be used to determine whether application of a group of trim codes resulted in pass or failure. At 1202, parameters of a training data pattern are received. The parameters can be mask, data byte 1, and data byte 2. A data pattern based on these parameters can be generated. For example, ONFI revision 4.1 specifies pattern generation based on mask/data bytes for example at section 5.30.4.4. At 1204, multiple trim codes are applied to a signal received on pin DQ<x>. The trim codes can be applied on received data or other signals from an external device or to be sent to an external device. At 1206, pass/fail results from the applications of the multiple trim codes can be provided. The pass/fail results can be based on the received data signals offset by a trim value as measured using strobe signal DQS as compared against a generated data pattern. At 1208, for matches of signals received on a pin with the generated data pattern for the pin, a pass can be recorded for the pin or for non-matches of signals received on a pin against the generated data pattern for the pin, a fail can be recorded for the pin. Accordingly, 1206 and 1208 provide pass/fail results for each pin for each applied trim code. For example, for two applied offset trim values, pass/fail results for each pin are represented as a first byte (corresponding to the trim code) and a second byte (corresponding to the second trim code). At 1210, the pass/fail results can be combined to represent a pass/fail status of each pin of a group of trim codes. For example, in 1210, 16 trim codes can be applied and each group of trim codes corresponds to 4 contiguous trim code offsets. For example, a determination of a pass/fail information for multiple pins can be made in parallel as opposed to one pin at a time. For 8 pins and pass/fail results from trim codes represented as A to D, the following equation can be used to determine pass/fail results: $F[x]=\sim((A[x]\&B[x]\&(C[x]|D[x])|(C[x]\&D[x]\&(A[x]\char`\^B[x]))$, where x represents a pin position and is 0 to 7. In an embodiment, if N−1 or fewer passes are counted for a pin from the four applied trim codes, then the bit representing the pin can be marked as a fail. In some embodiments, N=3, although other values of N can be used.

For example, if bit0 (corresponding to pin DQ0) is a pass in N or more of results from applied trim codes, bit0 is marked as a pass. In some embodiments, for right and left most bit positions (e.g., bit7 and bit0), N=4. A trim code for each pin can be determined based on the pass/fail results from one or more groups of trim codes. At 1212, the pass/fail results determined from application of multiple trim codes can be output and used for received or transmitted signals on each DQ pin.

Figure 13:
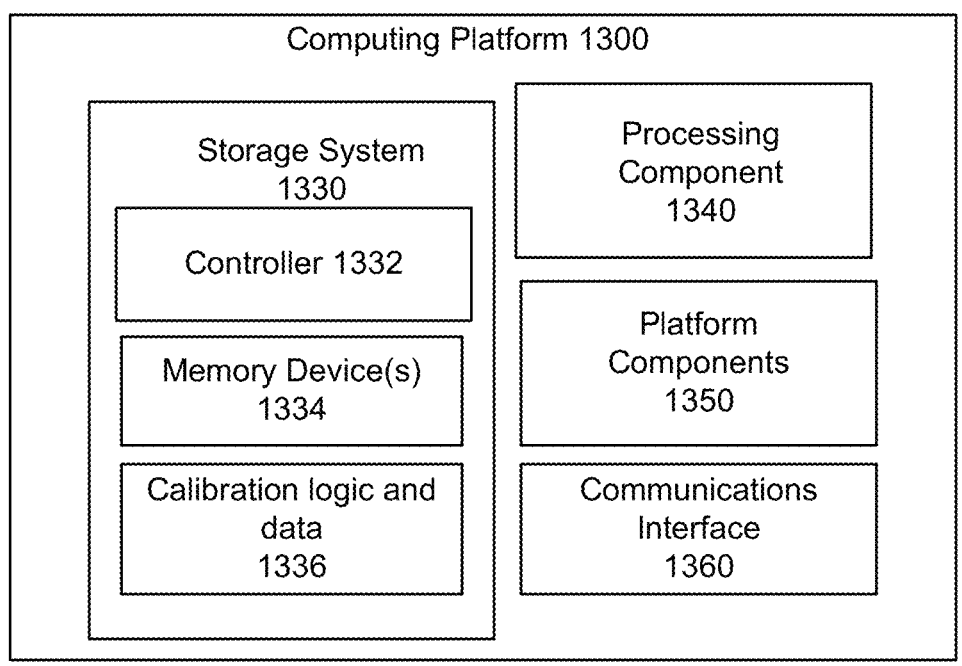
FIG. 13 depicts an example computing platform.

FIG. 13 depicts an example computing platform 1300. In some examples, as shown in FIG. 13, computing platform 1300 may include one or more of: a storage system 1330, a processing component 1340, platform components 1350, or a communications interface 1360. Computing platform 1300 can be powered by any or a combination of: wall outlet power, alternating current (AC), solar power, battery power, or motion-generated power.

According to some examples, storage system 1330 includes a controller 1332, memory devices(s) 1334, and calibration logic and data 1336. For these examples, logic and/or features resident at or located at controller 1332 may execute at least some processing operations described herein and may include a storage media. Also, memory device(s) 1334 may include similar types of volatile or non-volatile memory such as any type of storage device such as single-level cell (SLC) NAND storage device, multi-level cell (MLC) NAND storage device, triple level cell (TLC) NAND storage device, Quad Level Cell (QLC) NAND storage device or non-volatile storage devices including 2, 4, 8, 16 levels of information, or other number of levels of information, and so forth. Other examples of memory device(s) 1334 may include memory devices that use chalcogenide phase change material (e.g., chalcogenide glass), NOR flash memory, single or multi-level phase change memory (PCM), a resistive memory, nanowire memory, ferroelectric transistor random access memory (FeTRAM), magneto resistive random access memory (MRAM) memory that incorporates memristor technology, or spin transfer torque MRAM (STT-MRAM), or a combination of any of the above, or other memory types. Other may include, but are not limited to, random-access memory (RAM), Dynamic RAM (D-RAM), double data rate synchronous dynamic RAM (DDR SDRAM), static random-access memory (SRAM), thyristor RAM (T-RAM) or zero-capacitor RAM (Z-RAM).

Calibration logic and data 1336 can include any circuitry or other logic used to calibrate or re-calibrate offset for any data pin, such as one or more DQ pins coupled to a memory device, as described herein. For example, trim codes for one or more pins can be stored and used to offset signal transfer on each pin.

According to some examples, processing component 1340 may include various hardware elements, software elements, or a combination of both. In some examples, platform components 1350 may include common computing elements, such as one or more processors, single or multi-cores, co-processors, memory units, chipsets, controllers, peripherals, interfaces, oscillators, timing devices, video cards, audio cards, multimedia I/O components (e.g., digital displays), power supplies, and so forth. Examples of memory units associated with either platform components 1350 or storage system 1330 may include without limitation, various types of computer readable and machine-readable storage media.

In some examples, communications interface 1360 may include logic and/or features to support a communication interface. For these examples, communications interface 1360 may include one or more communication interfaces that operate according to various communication protocols or standards to communicate over direct or network communication links. Direct communications may occur through a direct interface via use of communication protocols or standards described in one or more industry standards (including progenies and variants) such as those associated with the SMBus specification, the PCIe specification, the NVMe specification, the SATA specification, SAS specification or the USB specification.

Communications interface 1360 can include radio frequency (RF) transceiver components for accessing wireless voice and/or data networks (e.g., using cellular telephone technology, data network technology such as 3G, 4G/LTE, Wi Fi, other IEEE 802.11 family standards, or other mobile communication technologies, or any combination thereof), components for short range wireless communication (e.g., using Bluetooth and/or Bluetooth LE standards, NFC, etc.), and/or other components. In some embodiments, communications interface 1360 can provide wired network connectivity (e.g., Ethernet) in addition to or instead of a wireless interface. Communications interface 1360 can be implemented using a combination of hardware (e.g., driver circuits, antennas, modulators/demodulators, encoders/decoders, and other analog and/or digital signal processing circuits) and software components. In some embodiments, communications interface 1360 can support multiple communication channels concurrently or at different times, using the same transport or different transports.

Computing platform 1300 may be part of a computing device that may be, for example, user equipment, a computer, a personal computer (PC), a desktop computer, a laptop computer, a notebook computer, a netbook computer, a tablet, a smart phone, virtual reality or augment reality device, autonomous driving or flying vehicle, Internet-of-things (IoT) device, embedded electronics, a gaming console, a server, a server array or server farm, a web server, a network server, a proxy device, a work station, a minicomputer, a main frame computer, a supercomputer, a network appliance, a web appliance, a distributed computing system, multiprocessor systems, processor-based systems, or combination thereof. Accordingly, functions and/or specific configurations of computing platform 1300 described herein, may be included or omitted in various embodiments of computing platform 1300, as suitably desired.

The components and features of computing platform 1300 may be implemented using any combination of discrete circuitry, ASICs, field programmable gate arrays (FPGAs), logic gates and/or single chip architectures. Further, the features of computing platform 1300 may be implemented using microcontrollers, programmable logic arrays and/or microprocessors or any combination of the foregoing where suitably appropriate. It is noted that hardware, firmware and/or software elements may be collectively or individually referred to herein as "logic", "circuit" or "circuitry."

The appearances of the phrase "one example" or "an example" are not necessarily all referring to the same example or embodiment. Any aspect described herein can be combined with any other aspect or similar aspect described herein, regardless of whether the aspects are described with respect to the same figure or element.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z."

What is claimed is:

1. A method comprising:
   determining first pass/fail results based at least, in part, on a comparison between received data on a pin0 as offset by a first offset and training data for the pin0;
   determining second pass/fail results based at least, in part, on a comparison between received data on the pin0 as offset by a second offset and the training data for the pin0;
   determining third pass/fail results based at least, in part, on a comparison between received data on a pin1 as offset by the first offset and the training data for the pin1;
   determining fourth pass/fail results based at least, in part, on a comparison between received data on the pin1 as offset by the second offset and the training data for the pin1;
   determining a group pass/fail result for the pin0 based at least, in part, on the first and second pass/fail results; and
   determining a group pass/fail result for the pin1 based at least, in part, on the third and fourth pass/fail results, wherein:
   determining the group pass/fail result for the pin0 occurs, at least partially in parallel with the determining the group pass/fail result for the pin1.

2. The method of claim 1, wherein
   the first offset corresponds to a first time offset amount,
   the second offset corresponds to a second time offset amount, and
   the first offset is different than the second offset.

3. The method of claim 1, wherein:
   determining the first pass/fail results based at least, in part, on a comparison between the received data on the pin0 as offset by the first offset and the training data for the pin0 comprises determining a pass if the received data on the pin0 as offset by the first offset matches the training data for the pin0 and
   determining the third pass/fail results based at least, in part, on a comparison between the received data on the pin1 as offset by the first offset and the training data for the pin1 comprises determining a pass if the received data on the pin1 as offset by the first offset matches the training data for the pin1.

4. The method of claim 1, wherein:
determining the second pass/fail results based at least, in part, on a comparison between the received data on the pin0 as offset by the second offset; comprises determining a pass if the received data on the pin0 as offset by the second offset matches the training data for the pin0 and
determining the fourth pass/fail results based at least, in part, on a comparison between the received data on the pin1 as offset by the second offset and the training data for the pin1 comprises determining a pass if the received data on the pin1 as offset by the second offset matches the training data for the pin1.

5. The method of claim 1, wherein determining the group pass/fail result for the pin0 and determining the group pass/fail result for the pin1 comprises using a translation matrix based at least, in part, on the first, second, third, and fourth pass/fail results.

6. The method of claim 1, wherein determining the group pass/fail result for the pin0 occurs, at least partially in parallel with the determining the group pass/fail result for the pin1 comprises determining:

$F[x]=\sim((A[x]\&B[x]\&(C[x]|D[x])|(C[x]\&D[x]\&(A[x]\hat{}B[x]))$, where $x$ represents a pin number.

7. The method of claim 1, further comprising:
determining a trim code to apply to signals received on the pin0 or to be transmitted from the pin0 based at least in part on the group pass/fail result for the pin0 and
determining a trim code to apply to signals received on the pin1 or to be transmitted from the pin1 based at least in part on the group pass/fail result for the pin1.

8. An apparatus comprising:
a trim offset application device to apply a first offset to an input data signal and to apply a second offset to the input data signal;
a comparator; and
a group status indicator, wherein:
the comparator is to:
perform a first comparison of a generated data pattern and the input data signal as offset by the first offset,
generate a pass/fail result for a first pin based on the first comparison,
generate a pass/fail result for a second pin based on the first comparison,
perform a second comparison of the generated data pattern against the input data signal as offset by a second offset,
generate a pass/fail result for a first pin based on the second comparison, and
generate a pass/fail result for the second pin based on the second comparison; and
the group status indicator is to:
determine a group pass/fail result for the first pin based at least on, in part, on the pass/fail results for the first pin from the first comparison and the second comparison and
determine a group pass/fail result for the second pin based at least on, in part, on the pass/fail results for the second pin from the first comparison and the second comparison, wherein the group status indicator is to determine the group pass/fail result for the first pin at least partially in parallel with the determine the group pass/fail result for the second pin.

9. The apparatus of claim 8, wherein
the first offset corresponds to a first time offset amount,
the second offset corresponds to a second time offset amount, and
the first offset is different than the second offset.

10. The apparatus of claim 8, further comprising a controller, wherein the controller is communicatively coupled to the group status indicator and the controller is to:
receive the group pass/fail result for the first pin and the group pass/fail result for the second pin;
select a first applied offset from the first or second offset to apply to the first pin; and
select a second applied offset from the first or second offset to apply to the second pin.

11. The apparatus of claim 8, wherein to determine the group pass/fail result for the first pin at least partially in parallel with the determine the group pass/fail result for the second pin, the group status indicator is to determine:

$F[x]=\sim((A[x]\&B[x]\&(C[x]|D[x])|(C[x]\&D[x]\&(A[x]\hat{}B[x]))$, where $x$ represents a pin number.

12. The apparatus of claim 8, wherein:
the trim offset application device is to apply a third offset to the input data signal and to apply a fourth offset to the input data signal,
the comparator is to:
perform a third comparison of the generated data pattern and the input data signal as offset by the third offset,
generate a pass/fail result for the first pin based on the third comparison,
generate a pass/fail result for a second pin based on the third comparison,
perform a fourth comparison of the generated data pattern against the input data signal as offset by the fourth offset,
generate a pass/fail result for the first pin based on the fourth comparison, and
generate a pass/fail result for the second pin based on the fourth comparison; and
the group status indicator is to:
determine the group pass/fail result for the first pin based at least, in part, on the pass/fail results for the first pin from the first comparison, the second comparison, the third comparison, and the fourth comparison and
determine the group pass/fail result for the second pin based at least, in part, on the pass/fail results for the second pin from the first comparison, the second comparison, the third comparison, and the fourth comparison, wherein the group status indicator is to determine the group pass/fail result for the first pin based at least, in part, on the pass/fail results for the first pin from the first comparison, the second comparison, the third comparison, and the fourth comparison at least partially in parallel with the determine the group pass/fail result for the second pin based at least, in part, on the pass/fail results for the second pin from the first comparison, the second comparison, the third comparison, and the fourth comparison.

13. The apparatus of claim 8, further comprising a controller and a memory device, wherein:

the controller is communicatively coupled to the group status indicator and the controller is to:
receive the group pass/fail result for the first pin and the group pass/fail result for the second pin,
select a first applied offset from the first or second offset to apply to the first pin,
select a second applied offset from the first or second offset to apply to the second pin,
the memory device is communicatively coupled to the controller and the trim offset application device, and
the trim offset application device is to apply the first applied offset to a signal received on the first pin and to apply the second applied offset to a signal received on the second pin and the trim offset application device is to provide the signal with first applied offset and the signal with second applied offset to the memory device.

14. The apparatus of claim 13, wherein the memory device comprises one or more of: a single-level cell (SLC) NAND storage device, a multi-level cell (MLC) NAND storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

15. An apparatus comprising:
means for performing a first comparison of a generated data pattern and an input data signal as offset by a first offset;
means for generating a pass/fail result for a first pin based on the first comparison;
means for generating a pass/fail result for a second pin based on the first comparison;
means for performing a second comparison of the generated data pattern against the input data signal as offset by a second offset;
means for generating a pass/fail result for the first pin based on the second comparison;
means for generating a pass/fail result for the second pin based on the second comparison;
means for determining a group pass/fail result for the first pin based at least on, in part, on the pass/fail results for the first pin from the first comparison and the second comparison; and
means for determining a group pass/fail result for the second pin based at least on, in part, on the pass/fail results for the second pin from the first comparison and the second comparison, wherein the determining the group pass/fail result for the first pin is at least partially in parallel with the determining the group pass/fail result for the second pin.

16. A system comprising:
a first pin;
a second pin;
a calibration device coupled to the first pin and the second pin; and
a memory device, the memory device coupled to the calibration device, wherein:
the calibration device is to apply a first offset to the first pin and a second offset to the second pin and
the calibration device to determine the first applied offset and the second applied offset based on multiple applied trim values formed from groups of trim results, the groups of trim results formed in parallel.

17. The system of claim 16, wherein the memory device comprises one or more of: a single-level cell (SLC) NAND storage device, a multi-level cell (MLC) NAND storage device, a memory device that uses chalcogenide phase change material, NOR flash memory, single or multi-level phase change memory (PCM), a resistive memory, nanowire memory, ferroelectric transistor random access memory (FeTRAM), magneto resistive random access memory (MRAM) memory that incorporates memristor technology, spin transfer torque MRAM (STT-MRAM), random-access memory (RAM), Dynamic RAM (D-RAM), double data rate synchronous dynamic RAM (DDR SDRAM), static random-access memory (SRAM), thyristor RAM (T-RAM), or zero-capacitor RAM (Z-RAM).

18. The system of claim 16, further comprising at least one processor communicatively coupled to the memory device and one or more of:
a network interface communicatively coupled to the at least one processor;
a display communicatively coupled to the at least one processor; or
a battery communicatively coupled to the at least one processor.

19. The system of claim 16, wherein the calibration device comprises:
trim offset application device to apply the first offset to an input data signal and to apply the second offset to the input data signal and
the calibration device comprising a comparator and a group status indicator, wherein:
the comparator is to:
perform a first comparison of a generated data pattern and the input data signal as offset by the first offset,
generate a pass/fail result for the first pin based on the first comparison,
generate a pass/fail result for the second pin based on the first comparison,
perform a second comparison of the generated data pattern against the input data signal as offset by the second offset,
generate a pass/fail result for the first pin based on the second comparison, and
generate a pass/fail result for the second pin based on the second comparison; and
the group status indicator is to:
determine a group pass/fail result for the first pin based at least on, in part, on the pass/fail results for the first pin from the first comparison and the second comparison and
determine a group pass/fail result for the second pin based at least on, in part, on the pass/fail results for the second pin from the first comparison and the second comparison, wherein the group status indicator is to determine the group pass/fail result for the first pin at least partially in parallel with the determine the group pass/fail result for the second pin.

20. The system of claim 19, further comprising a controller, wherein the controller is communicatively coupled to the calibration device and is to:
receive the group pass/fail result for the first pin and the group pass/fail result for the second pin;
select the first applied offset from the first or second offset to apply to the first pin; and select the second applied offset from the first or second offset to apply to the second pin.

\* \* \* \* \*